United States Patent
Sung et al.

(10) Patent No.: US 12,376,306 B2
(45) Date of Patent: Jul. 29, 2025

(54) SEMICONDUCTOR DEVICE INCLUDING PASS TRANSISTORS

(71) Applicant: SK hynix Inc., Icheon-si (KR)

(72) Inventors: Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 611 days.

(21) Appl. No.: 17/707,873

(22) Filed: Mar. 29, 2022

(65) Prior Publication Data

US 2023/0165006 A1     May 25, 2023

(30) Foreign Application Priority Data

Nov. 22, 2021 (KR) .................. 10-2021-0161719

(51) Int. Cl.
    *H10D 99/00*     (2025.01)
    *H10B 41/35*     (2023.01)
    *H10B 43/35*     (2023.01)

(52) U.S. Cl.
    CPC ............ *H10B 43/35* (2023.02); *H10B 41/35* (2023.02)

(58) Field of Classification Search
    CPC ........ H10B 43/35; H10B 41/35; H10B 43/40; H10B 43/50; H10B 43/27; H10B 43/30; H10B 12/00; H10B 41/30; H10B 41/40; G11C 16/0483
    USPC ...................................................... 257/144
    See application file for complete search history.

(56) References Cited

U.S. PATENT DOCUMENTS

| | | | |
|---|---|---|---|
| 11,183,246 B1* | 11/2021 | Oh | G11C 16/08 |
| 2012/0267699 A1* | 10/2012 | Kiyotoshi | H10B 41/35 |
| | | | 257/E27.103 |
| 2013/0215684 A1* | 8/2013 | Oh | H10B 41/41 |
| | | | 257/314 |
| 2013/0234234 A1* | 9/2013 | Yoo | H10B 43/27 |
| | | | 438/270 |
| 2017/0077230 A1* | 3/2017 | Ikeda | H01L 29/78696 |
| 2018/0076208 A1* | 3/2018 | Sakuma | H10B 43/20 |
| 2019/0067316 A1* | 2/2019 | Oh | G11C 16/10 |
| 2019/0393241 A1* | 12/2019 | Baek | H10B 43/35 |
| 2020/0312830 A1* | 10/2020 | Oh | H10B 43/40 |
| 2020/0312868 A1* | 10/2020 | Xiao | H01L 29/42352 |
| 2020/0395341 A1* | 12/2020 | Maejima | H01L 24/08 |
| 2021/0183770 A1* | 6/2021 | Kim | H10B 41/27 |
| 2021/0210475 A1* | 7/2021 | Sung | H01L 23/528 |
| 2021/0217480 A1* | 7/2021 | Oh | G11C 16/16 |
| 2021/0217760 A1* | 7/2021 | Yang | H10B 43/10 |
| 2022/0020764 A1* | 1/2022 | Oh | H01L 21/76816 |

(Continued)

FOREIGN PATENT DOCUMENTS

KR    10-2015-0087991 A    7/2015

*Primary Examiner* — Sheikh Maruf

(57) ABSTRACT

A semiconductor device includes a stack including a plurality of electrode layers and a plurality of interlayer dielectric layers that are alternately stacked in a vertical direction on a substrate; and a plurality of vertical pass transistors disposed over the stack, and each of the plurality of vertical pass transistors coupled to a corresponding electrode layer, wherein the plurality of vertical pass transistors includes a plurality of first vertical pass transistors and a plurality of second vertical pass transistors, and the plurality of second vertical pass transistors are disposed over the plurality of first vertical pass transistors to be staggered with the plurality of first vertical pass transistors.

14 Claims, 12 Drawing Sheets

(56) References Cited

U.S. PATENT DOCUMENTS

| | | | |
|---|---|---|---|
| 2022/0059480 A1* | 2/2022 | Park | H01L 25/18 |
| 2022/0077126 A1* | 3/2022 | Choi | G11C 16/08 |
| 2022/0190131 A1* | 6/2022 | Ko | H01L 23/5283 |
| 2022/0246196 A1* | 8/2022 | Takenaka | G11C 16/26 |
| 2022/0406941 A1* | 12/2022 | Karda | H10B 41/50 |

* cited by examiner

SEMICONDUCTOR DEVICE INCLUDING PASS TRANSISTORS

CROSS-REFERENCE TO RELATED APPLICATION

The present application claims priority under 35 U.S.C. § 119(a) to Korean Patent Application No. 10-2021-0161719 filed in the Korean Intellectual Property Office on Nov. 22, 2021, which is incorporated herein by reference in its entirety.

BACKGROUND

1. Technical Field

Various embodiments generally relate to a semiconductor technology, and more particularly, to a semiconductor device that includes pass transistors.

2. Related Art

A memory device with a two-dimensional or planar structure has been developed to store more data in the same area by using a fine patterning process. However, as the line width of a circuit is narrowed due to the demand for high integration, interference between memory cells increases and causes various limitations such as degradation in performance. In addition to such structural limitations, an increase in manufacturing cost is inevitable because the expensive equipment is required to pattern increasingly narrow fine lines.

To overcome limitations of the two-dimensional memory devices, an alternative to a three-dimensional memory device has been proposed. A three-dimensional memory device has advantages in that a larger capacity may be realized within the same area by stacking memory cells in a vertical direction, thereby increasing the number of stacks through and providing high performance and excellent power efficiency.

In a three-dimensional memory device, the degree of integration may be increased by increasing the number of electrode layers (word lines) to be stacked. However, if the number of electrode layers to be stacked is increased, the number of pass transistors serving to transfer operating voltages to the electrode layers and the size of the device also increase.

SUMMARY

Various embodiments are directed to a semiconductor device with reduced size.

In an embodiment, a semiconductor device may include: a stack including a plurality of electrode layers and a plurality of interlayer dielectric layers that are alternately stacked in a vertical direction on a substrate; and a plurality of vertical pass transistors disposed over the stack, and each of the plurality of vertical pass transistors coupled to a corresponding electrode layer, wherein the plurality of vertical pass transistors includes a plurality of first vertical pass transistors and a plurality of second vertical pass transistors, and the plurality of second vertical pass transistors are disposed over the plurality of first vertical pass transistors to be staggered with the plurality of first vertical pass transistors.

In an embodiment, a semiconductor device may include: a stack including a plurality of electrode layers and a plurality of interlayer dielectric layers that are alternately stacked in a vertical direction on a substrate; a gate conductive layer disposed over the stack; a plurality of semiconductor pillars extending in the vertical direction in the gate conductive layer, and each coupled to a corresponding electrode layer; and a plurality of gate dielectric layers that surround and isolate the plurality of semiconductor pillars and the gate conductive layer from each other, wherein the plurality of semiconductor pillars include a plurality of first semiconductor pillars and a plurality of second semiconductor pillars, which are disposed over the plurality of first semiconductor pillars, to be staggered with the plurality of first semiconductor pillars.

DETAILED DESCRIPTION

Figure 1:
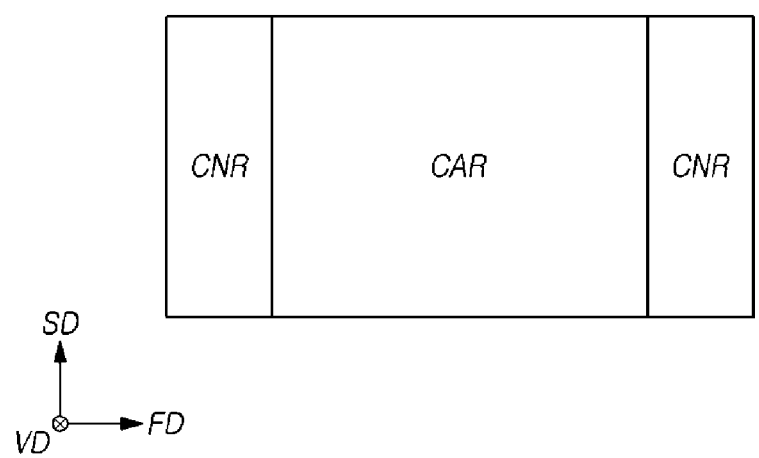
FIG. 1 is a diagram schematically illustrating a semiconductor device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinafter, embodiments of the present disclosure will be described in detail with reference to the accompanying drawings.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other. In the drawings, a direction indicated by an arrow and a direction opposite thereto indicate the same direction.

FIG. 1 is a diagram schematically illustrating a semiconductor device in accordance with an embodiment of the present disclosure.

Referring to FIG. 1, a semiconductor device in accordance with an embodiment of the present disclosure may include a cell array region CAR and connection regions CNR. Although FIG. 1 illustrates two connection regions CNR disposed on both sides of the cell array region CAR, the present disclosure is not limited thereto. The number and positions of the connection regions CNR may be changed according to various different schemes. For example, one connection region may be disposed on one side of a cell array region.

A memory cell array may be disposed in the cell array region CAR. The memory cell array may include a plurality of memory cells, which are three-dimensionally stacked, and a plurality of row lines and a plurality of bit lines that are electrically coupled to the plurality of memory cells. In the connection region CNR, there may be disposed a plurality of pass transistors that transfer an operating voltage to the row lines, contact plugs that electrically couple the row lines and the plurality of pass transistors, and a wiring structure that includes wiring lines.

By stacking the memory cells vertically, the number of memory cells may be increased without increasing the area of the cell array region CAR. However, if the number of stack of memory cells increases, then the number of pass transistors that transfer an operating voltage to the memory cells increases in correspondence, and thus, the size of the connection region CNR increases. A larger connection region CNR makes it difficult to reduce the size of the semiconductor device. Embodiments of the present disclosure suggest measures capable of reducing a layout area normally consumed for pass transistors, thereby contributing to reducing the size of the connection region CNR and reducing an overall size of the semiconductor device.

Figure 2:
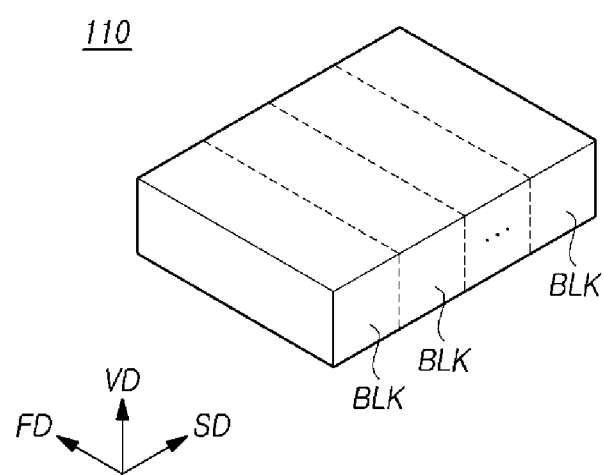
FIG. 2 is a diagram illustrating a memory cell array in accordance with an embodiment of the present disclosure.

FIG. 2 is a diagram schematically illustrating a memory cell array in accordance with an embodiment of the present disclosure.

Referring to FIG. 2, a memory cell array 110 may include a plurality of memory blocks BLK. Each memory block BLK may include a stack including a plurality of electrode layers and a plurality of interlayer dielectric layers that are alternately stacked in the vertical direction VD and stacked on a plane extending in the first direction FD and the second direction SD. The stack may be coupled with a plurality of cell plugs to configure the memory cells arranged three-dimensionally.

Figure 3:
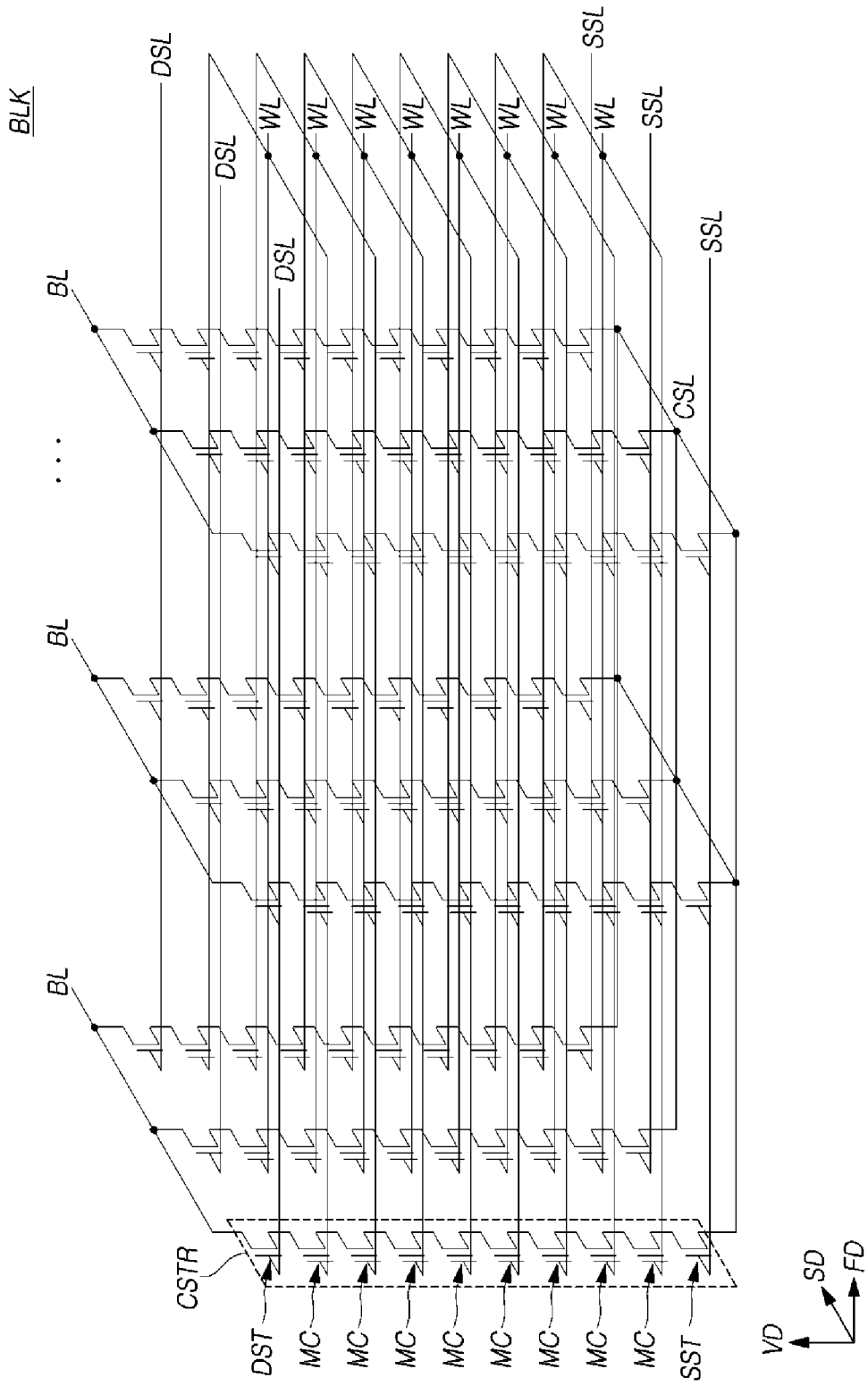
FIG. 3 is an exemplary circuit diagram illustrating a memory block of FIG. 2.

FIG. 3 is an exemplary circuit diagram illustrating a memory block of FIG. 2.

Referring to FIG. 3, a memory block BLK may include a plurality of cell strings CSTR, which are coupled between a plurality of bit lines BL and a common source line CSL. A plurality of cell strings CSTR may be coupled in parallel to each bit line BL. The cell strings CSTR may be coupled in common to the common source line CSL. The plurality of cell strings CSTR may be coupled between the plurality of bit lines BL and the one common source line CSL.

Each cell string CSTR may include a drain select transistor DST that is coupled to a bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in the vertical direction VD.

Source select lines SSL, a plurality of word lines WL and drain select lines DSL may be arranged in the vertical direction VD between the common source line CSL and the bit lines BL. The drain select lines DSL may be coupled to the gates of corresponding drain select transistors DST. The source select lines SSL may be coupled to the gates of corresponding source select transistors SST. The word lines WL may be coupled to the gates of corresponding memory cells MC. Memory cells MC that are coupled in common to one word line WL may configure one page.

Figure 4:
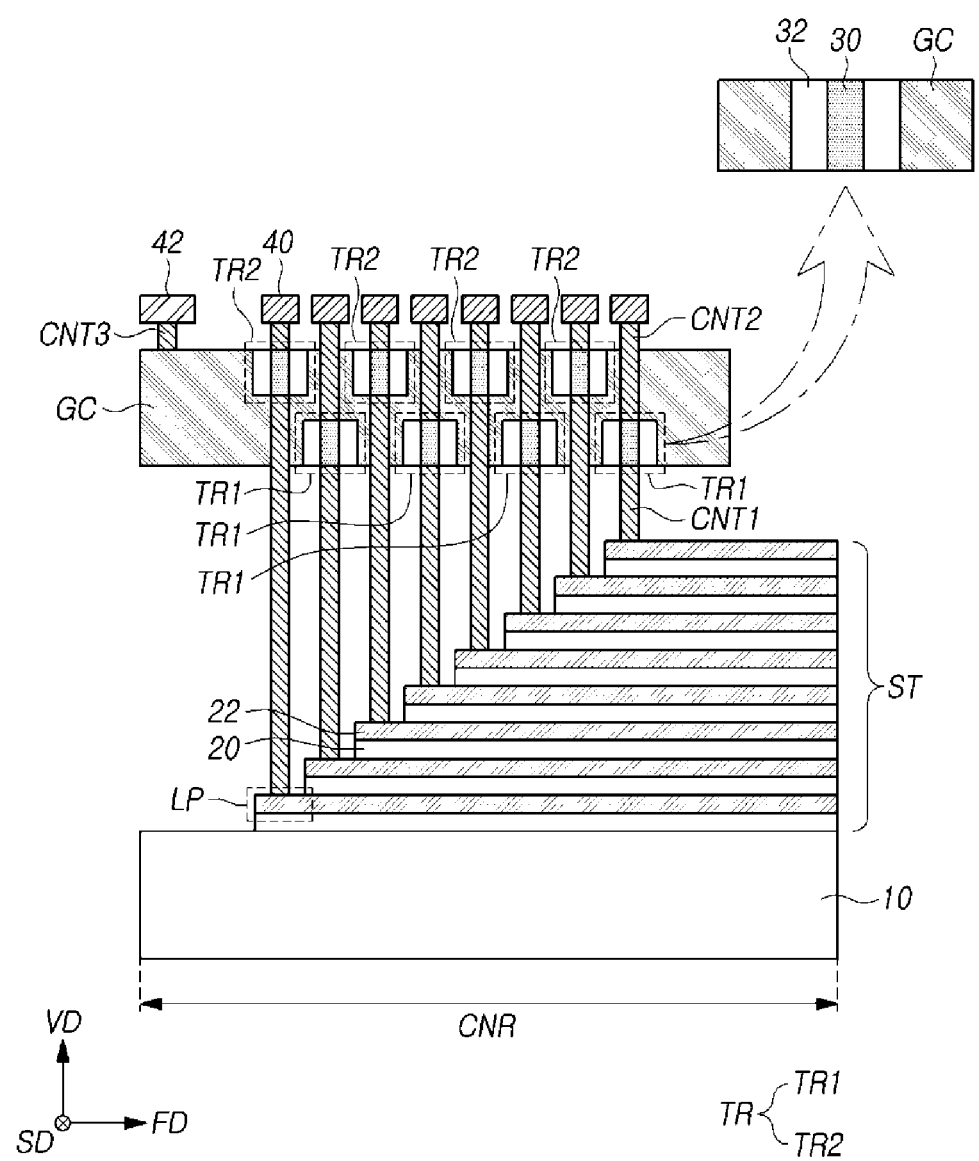
FIG. 4 is an exemplary cross-sectional view illustrating a connection region of a semiconductor device in accordance with an embodiment of the present disclosure.

FIG. 4 is an exemplary cross-sectional view illustrating a connection region of a semiconductor device in accordance with an embodiment of the present disclosure.

Referring to FIG. 4, a semiconductor device may include a stack ST including a plurality of electrode layers 20 and a plurality of interlayer dielectric layers 22 that are alternately stacked on a substrate 10, and a plurality of vertical pass transistors TR that are disposed over the stack ST and are coupled to corresponding electrode layers 20, respectively. The plurality of vertical pass transistors TR may include a plurality of first vertical pass transistors TR1 and a plurality of second vertical pass transistors TR2, which are disposed over the plurality of first vertical pass transistors TR1 to be staggered with the plurality of first vertical pass transistors TR1. For example, the plurality of first vertical pass transistors TR1 may be alternatingly staggered with plurality of second vertical pass transistors TR2 in the vertical direction VD, along the second direction SD in the connection region CNR.

The substrate 10 may be a monocrystalline semiconductor film. For example, the substrate 10 may be a bulk silicon substrate, a silicon-on-insulator substrate, a germanium substrate, a germanium-on-insulator substrate, a silicon-germanium substrate, or an epitaxial thin film formed through selective epitaxial growth.

The electrode layers 20 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The interlayer dielectric layers 22 may include silicon oxide.

The electrode layers 20 may configure row lines. From among the electrode layers 20, at least one electrode layer 20 from a lowermost electrode layer 20 may configure a source select line and at least one electrode layer 20 from an uppermost electrode layer 20 may configure a drain select line. The electrode layers 20 between the source select line and the drain select line may configure word lines.

Although not illustrated, a plurality of cell plugs may be formed in a cell array region (CAR of FIG. 1) to extend to the substrate 10 by passing through the stack ST in the vertical direction VD. Each cell plug may include a channel layer and a gate dielectric layer. The channel layer may include polysilicon or monocrystalline silicon, and may include, in some regions thereof, a p-type impurity such as boron (B). The gate dielectric layer may have a shape that surrounds an outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. A source select transistor may be configured in areas or regions where the source select line surrounds the cell plug. Memory cells may be configured in areas or regions where the word lines surround the cell plug. A drain select transistor may be configured in areas or regions where the drain select line surrounds the cell plug. The source select transistor, the memory cells and the drain select transistor disposed along one cell plug may configure one cell string.

In a connection region CNR, a step structure STEP may be formed in the stack ST to expose pad regions LP of the electrode layers 20. Each pad region LP is a portion of an electrode layer 20 that protrudes more than an overlying electrode layer 20. The step structure STEP may be configured as the pad regions LP of the electrode layers 20 are disposed in a step-like pattern in the first direction FD, which is an extending direction of the row lines. In this example, it may be defined that the step structure STEP is disposed in the first direction FD.

The vertical pass transistor TR represents a pass transistor in which the direction of a channel is the vertical direction VD. The vertical pass transistor TR may control current flow between two contacts coupled to its top and bottom surfaces, respectively.

The vertical pass transistor TR may include a semiconductor pillar 30, a gate dielectric layer 32 and a gate conductive layer GC. The semiconductor pillar 30 extends in the vertical direction VD at the center portion of the vertical pass transistor TR, the gate dielectric layer 32 surrounds a sidewall of the semiconductor pillar 30, and the gate conductive layer GC surrounds a sidewall of the gate dielectric layer 32. The semiconductor pillar 30 and the gate conductive layer GC are insulated from each other by the gate dielectric layer 32.

The gate conductive layer GC may be configured in a wiring layer over the stack ST. The gate conductive layer GC may have, for example, a plate shape extending in the first direction FD. In the present embodiment, the gate conductive layer GC may function as a gate electrode that is shared by the first vertical pass transistors TR1 and the second vertical pass transistors TR2. The first vertical pass transistors TR1 and the second vertical pass transistors TR2 may share the one gate conductive layer GC.

Each of the semiconductor pillars 30 of the first and second vertical pass transistors TR1 and TR2 may pass through, in the vertical direction VD, a partial thickness of the gate conductive layer GC. The semiconductor pillars 30 of the first vertical pass transistors TR1 may extend upward from a bottom surface of the gate conductive layer GC in the vertical direction VD. The top of these semiconductor pillars 30 may be configured not to pass through the top surface of the gate conductive layer GC and may be located within the gate conductive layer GC. The semiconductor pillars 30 of the second vertical pass transistors TR2 may extend downward from a top surface of the gate conductive layer GC in the vertical direction VD. The bottom of these semiconductor pillars 30 may be configured not to pass through the bottom surface of the gate conductive layer GC and may be located within the gate conductive layer GC.

Although FIG. 4 illustrates an embodiment in which the first vertical pass transistors TR1 and the second vertical pass transistors TR2 share the one gate conductive layer GC, the present disclosure is not limited thereto. The first vertical pass transistors TR1 may share one gate conductive layer, and the second vertical pass transistors TR2 may share another gate conductive layer.

The semiconductor pillar 30 of each of the vertical pass transistors TR may be coupled to the pad region LP of a corresponding electrode layer 20 through a lower contact CNT1. The semiconductor pillar 30 of each of the vertical pass transistors TR may be coupled to a corresponding first top wiring line 40 through a first upper contact CNT2. First top wiring lines 40 may function as global row lines, which serve to transfer an operating voltage to the vertical pass transistors TR.

Although not illustrated, sidewall dielectric layers may be formed between the lower contacts CNT1 coupled to the semiconductor pillars 30 of the second vertical pass transistors TR2 and the gate conductive layer GC and between the first upper contacts CNT2 coupled to the semiconductor pillars 30 of the first vertical pass transistors TR1 and the gate conductive layer GC. The sidewall dielectric layers isolate the lower contacts CNT1 and the gate conductive layer GC from each other and isolate the first upper contacts CNT2 and the gate conductive layer GC from each other.

The gate conductive layer GC may be coupled to a second top wiring line 42 through a second upper contact CNT3. The second top wiring line 42 may function as a block word line serving to transfer a block selection signal. The first vertical pass transistors TR1 and the second vertical pass transistors TR2 may be turned on all at once or at the same time in response to the block selection signal, which transfers operating voltages loaded on the first top wiring lines 40 to the electrode layers 20.

The plurality of second vertical pass transistors TR2 may be located vertically above the plurality of first vertical pass transistors TR1 with respect to the first direction FD and may be disposed to be staggered in the first direction FD with respect to the plurality of first vertical pass transistors TR1. Put another way, in an arrangement structure, the vertical pass transistors TR are arranged in the first direction FD while being disposed to form an up and down zigzag pattern.

In order for the vertical pass transistors TR to operate normally, adjacent vertical pass transistors TR should be spaced apart from each other with an interval or distance equal to or larger than a predetermined size. According to embodiments disclosed herein, by arranging the vertical pass transistors TR in an up and down zigzag pattern, the interval between adjacent vertical pass transistors TR may be maintained to be equal to or larger than the predetermined size, but the area occupied by the vertical pass transistors TR may be reduced.

Figure 5:
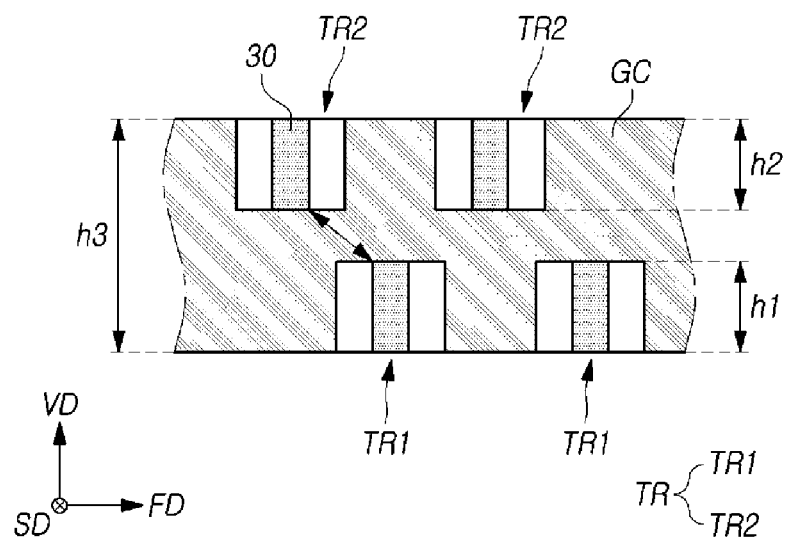
FIG. 5 is an enlarged view illustrating a gate conductive layer and some vertical pass transistors of FIG. 4.
Figure 6:
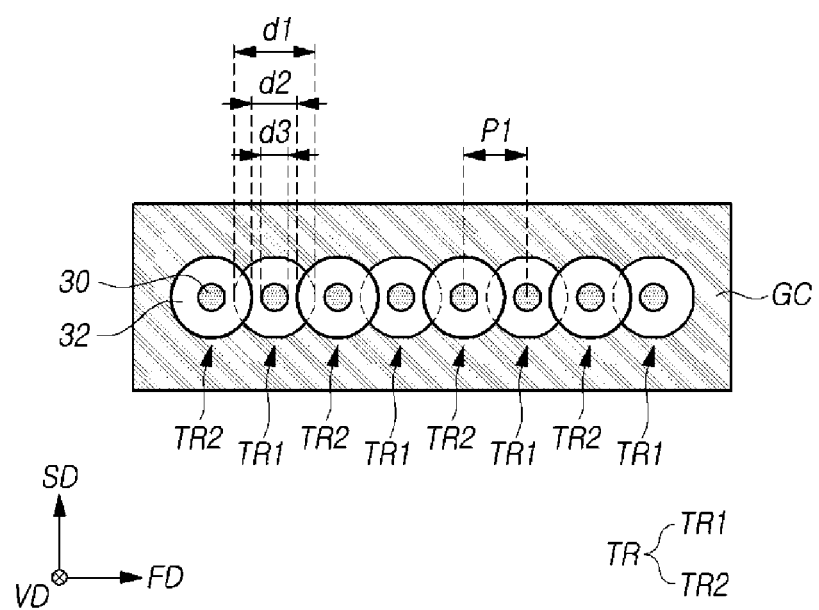
FIG. 6 is a top view illustrating the gate conductive layer and vertical pass transistors of FIG. 4.

FIG. 5 is an enlarged view illustrating a gate conductive layer and some vertical pass transistors of FIG. 4, and FIG. 6 is a top view illustrating the gate conductive layer and vertical pass transistors of FIG. 4.

Referring to FIG. 5, a semiconductor pillar 30 of a first vertical pass transistor TR1 having a first height h1 may extend in the vertical direction VD from a bottom surface of the gate conductive layer GC to the inside of the gate conductive layer GC. The semiconductor pillar 30 of the second vertical pass transistor TR2 having a second height h2 may extend in the vertical direction VD from a top surface of the gate conductive layer GC to the inside of the gate conductive layer GC.

A height h3 of the gate conductive layer GC may be larger than the sum of the first height h1 and the second height h2. That is to say, the height h3 of the gate conductive layer GC may be larger than the sum of the height of the semiconductor pillar 30 of one of the first vertical pass transistors TR1 and the height of the semiconductor pillar 30 of one of the second vertical pass transistors TR2. As a result, the top of semiconductor pillars 30 of the first vertical pass transistors TR1 and the bottom of semiconductor pillars 30 of the second vertical pass transistors TR2 need not be located at the same vertical position.

A first vertical pass transistor TR1 and a second vertical pass transistor TR2 adjacent to each other in the first direction may partially overlap with each other in the vertical direction VD. For example, the gate dielectric layers 32 of the first vertical pass transistor TR1 and an adjacent second vertical pass transistor TR2 may partially overlap with each other in the vertical direction VD.

The semiconductor pillars 30 of the plurality of second vertical pass transistors TR2 may be disposed to alternate in the first direction FD with the semiconductor pillars 30 of the plurality of first vertical pass transistors TR1. As with the vertical pass transistors TR, the semiconductor pillars 30 may be arranged in the first direction FD while forming an arrangement structure of an up and down zigzag pattern. Thus, the semiconductor pillars 30 of the second vertical pass transistors TR2 and the semiconductor pillars 30 of the first vertical pass transistors TR1 may be offset from each other in both the first direction FD and the vertical direction VD.

Adjacent semiconductor pillars 30 of the first vertical pass transistor TR1 and the second vertical pass transistor TR2 may face each other in a diagonal direction that crosses at an angle with a vertical direction VD and a first direction FD. The semiconductor pillars 30 of the first vertical pass transistor TR1 and the second vertical pass transistor TR2 that are adjacent to each other may not overlap with each other in the vertical direction VD.

Referring to FIG. 6, when viewed from the top, the vertical pass transistors TR may be arranged with a first pitch P1 in the first direction FD. The first pitch P1 may be defined as the distance between the centers of adjacent vertical pass transistors TR or the centers of adjacent semiconductor pillars 30.

The center of a vertical pass transistor TR may coincide with the center of a semiconductor pillar 30. The pitch of the semiconductor pillars 30 indicates the distance between the centers of adjacent semiconductor pillars 30, and may be the same as the pitch of the vertical pass transistors TR, which is first pitch P1.

When viewed from the top, the first vertical pass transistors TR1 and the second vertical pass transistors TR2 may be alternately disposed in the first direction FD. Therefore, the first pitch P1 may be regarded as the distance between the center of a first vertical pass transistor TR1 and the center of the next second vertical pass transistor TR2.

When a dimension of the gate dielectric layer 32 in the first direction FD is d1, the first pitch P1 may have a value smaller than d1. In this embodiment, the first vertical pass transistor TR1 and the second vertical pass transistor TR2 that are adjacent to each other partially overlap with each other.

In an embodiment, a dimension in the first direction FD between adjacent first vertical pass transistors TR1 is d2, a dimension of the semiconductor pillar 30 is d3, and the first pitch P1 has a value larger than d2 and d3. As a result, the semiconductor pillars 30 of a first vertical pass transistor TR1 and an adjacent second vertical pass transistor TR2 do not overlap with each other in the vertical direction VD.

Figure 7:
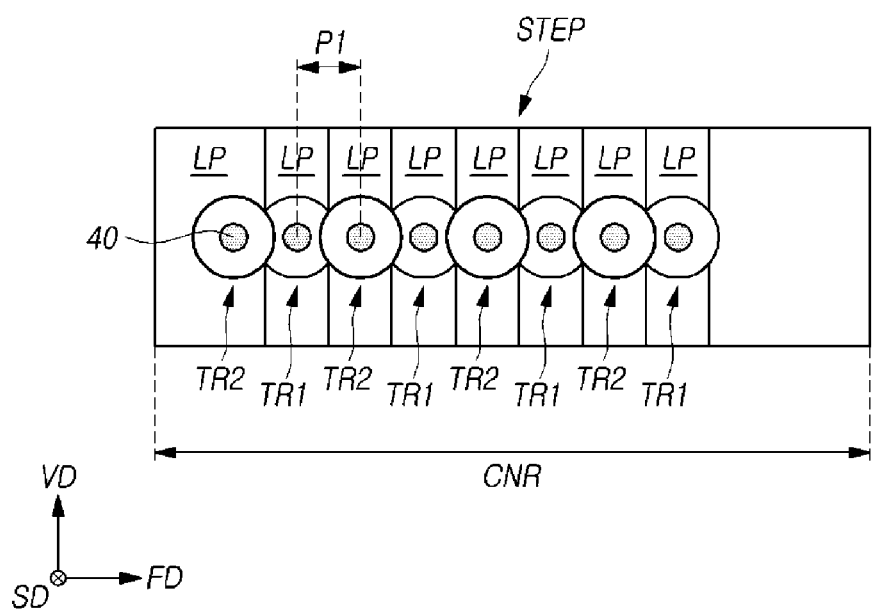
FIG. 7 is a top view illustrating a step structure and vertical pass transistors of FIG. 4.

FIG. 7 is a top view illustrating a step structure and vertical pass transistors of FIG. 4.

Referring to FIG. 7, a step structure STEP may be configured such that each pad region LP overlaps with a semiconductor pillar 30 of a corresponding vertical pass transistor TR in the vertical direction VD. By disposing the pad region LP and the semiconductor pillar 30, which are coupled to each other, to overlap with each other in the vertical direction VD, an electrical coupling path coupling the pad region LP and the semiconductor pillar 30 may be configured to have the same length as the shortest distance between the pad region LP and the semiconductor pillar 30.

In order to allow the pad region LP and the semiconductor pillar 30 coupled to each other to overlap with each other in the vertical direction VD, the width of the pad region LP in the first direction FD should be selected to have a size corresponding to the pitch P1 of the semiconductor pillars 30, that is, the pitch of the vertical pass transistors TR. When the pitch P1 of the vertical pass transistors TR increases, the width of the pad region LP in the first direction FD should be increased, and when the pitch P1 of the vertical pass transistors TR decreases, the width of the pad region LP in the first direction FD should be decreased.

The length of the connection region CNR in the first direction FD may be determined by the pitch of the vertical pass transistors TR. When the pitch of the vertical pass transistors TR increases, the length of the connection region CNR in the first direction FD increases, and when the pitch of the vertical pass transistors TR decreases, the length of the connection region CNR in the first direction FD decreases.

According to embodiments of the present disclosure, the pitch P1 of the vertical pass transistors TR may be decreased by arranging the vertical pass transistors TR in an up and down zigzag pattern, and therefore the length of the connection region CNR in the first direction FD and the size of the semiconductor device may be reduced.

Figure 8:
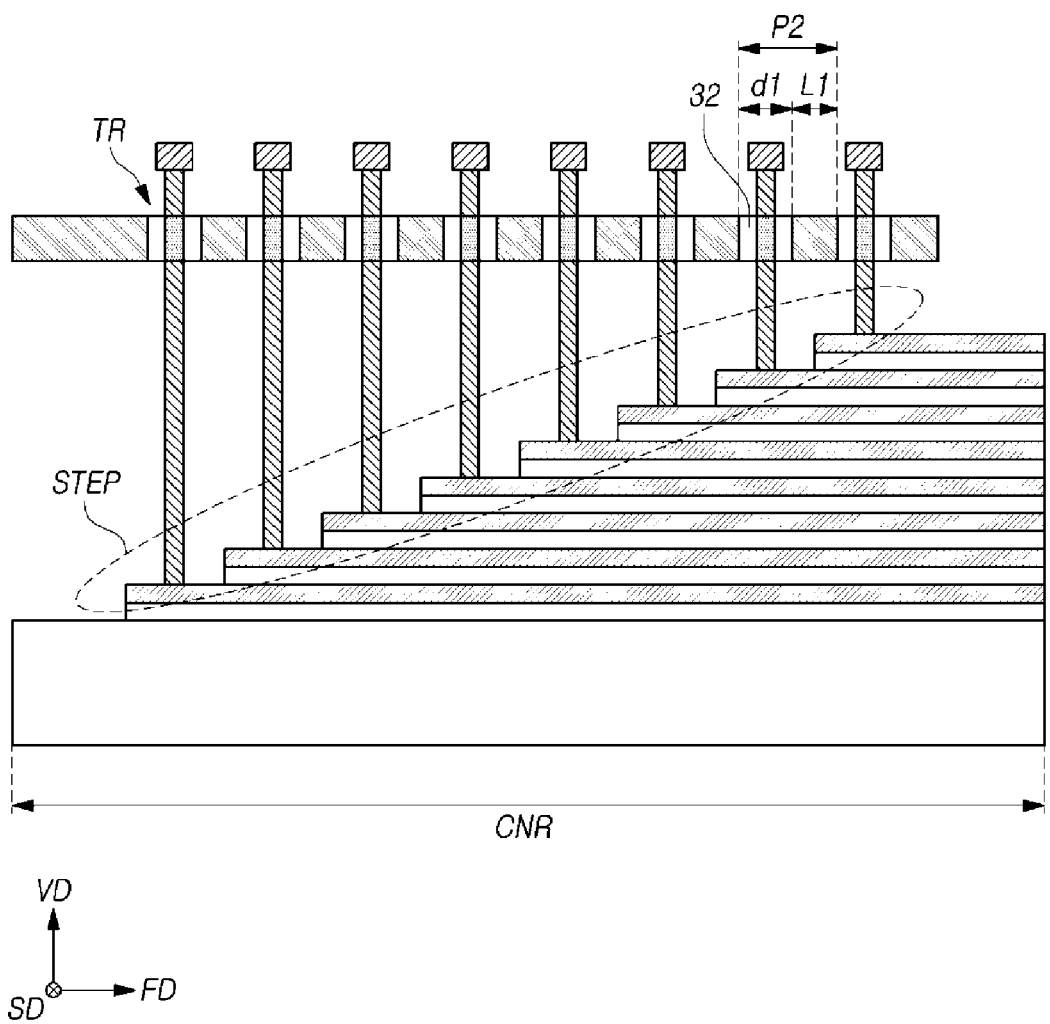
FIG. 8 is a cross-sectional view illustrating an example of a semiconductor device that is different from embodiments of the present disclosure.
Figure 9:
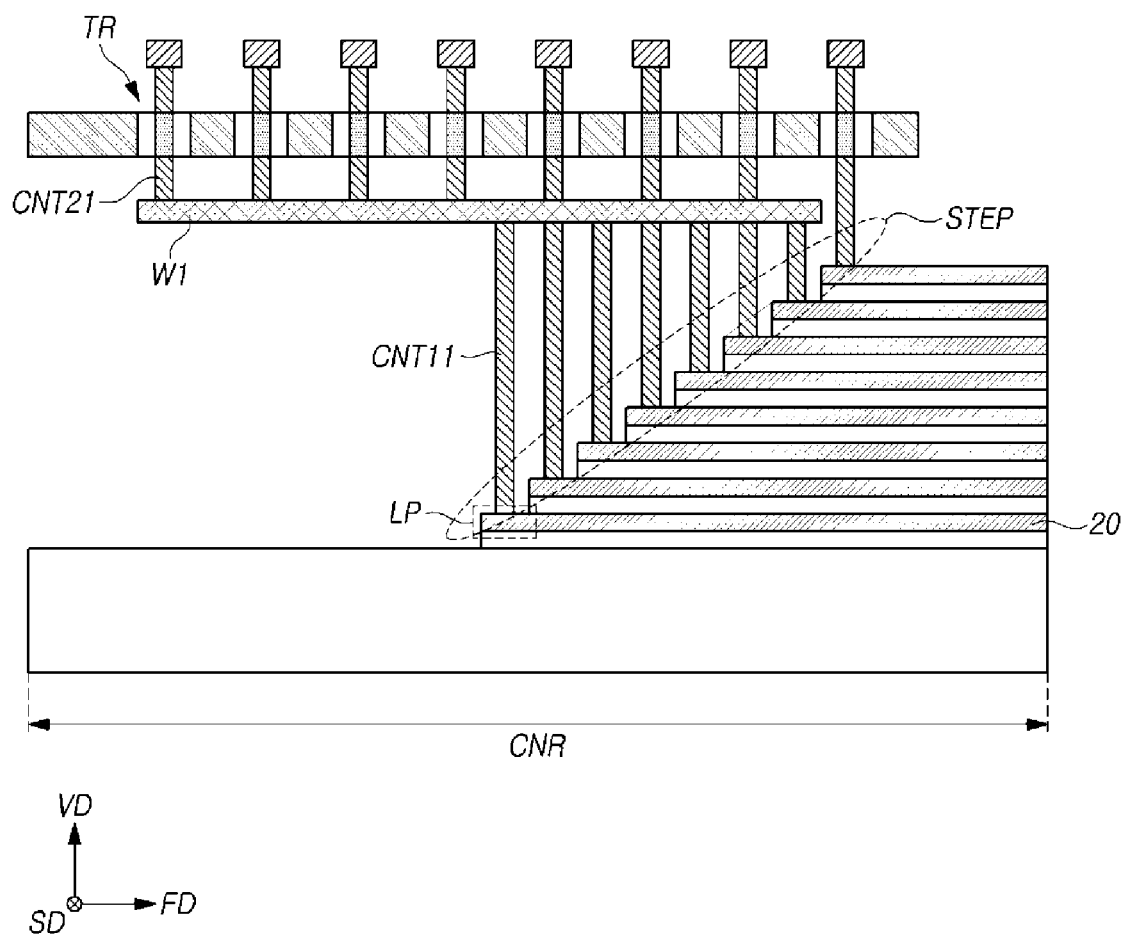
FIG. 9 is a cross-sectional view illustrating another example of a semiconductor device that is different from embodiments of the present disclosure.

FIG. 8 is a cross-sectional view illustrating an example of a semiconductor device that is different from embodiments of the present disclosure, and FIG. 9 is a cross-sectional view illustrating another example of a semiconductor device that is different from embodiments of the present disclosure.

Referring to FIG. 8, vertical pass transistors TR may be arranged in a line in a single layer in the first direction FD. In this case, a pitch P2 of the vertical pass transistors TR has a size corresponding to the sum of an interval Li between gate dielectric layers 32 of adjacent vertical pass transistors TR and a size d1 of the dimension of the gate dielectric layer 32 in the first direction FD. As described above with reference to FIG. 6, according to embodiments of the present disclosure, it is possible to configure the pitch P1 of the vertical pass transistors TR to have a size smaller than d1. Accordingly, in embodiments of the present disclosure, the length of the connection region CNR in the first direction FD and the size of the semiconductor device may be reduced when compared to a device according to the example of FIG. 8.

Referring to FIG. 9, a pad region LP may be configured to have a minimum feature size required for landing a contact CNT11. In this case, the length of a step structure STEP in the first direction FD may be reduced compared to that of a device of FIG. 8, but because the pitch of vertical pass transistors TR is the same as P2, the length of a connection region CNR in the first direction FD and the size of the semiconductor device are not reduced. Furthermore, each vertical pass transistor TR and each pad region LP that should be coupled to each other must be disposed to be spaced apart from each other in the first direction FD, and wiring lines W1 routed in the first direction FD are required to couple vertical pass transistors TR and pad regions LP. Therefore, if the number of electrode layers 20 increases as the degree of integration is increased, the number of wiring lines W1 increases. A resulting wiring bottleneck phenomenon makes it difficult or impossible to dispose wiring lines.

When the dimension of the vertical pass transistor TR is reduced, it is possible to reduce the length of the connection region CNR in the first direction FD. However, if the dimension of the vertical pass transistor TR is reduced too much, the drivability of the vertical pass transistor TR decreases, and thus, functional errors may occur.

As described above, according to the embodiments of the present disclosure, by arranging the vertical pass transistors TR in an up and down zigzag pattern, the length of the connection region CNR in the first direction FD may be reduced without reducing the size of the vertical pass transistor TR. Therefore, it is possible to reduce the size of the semiconductor device without causing a decrease in the drivability of the vertical pass transistor TR and resulting functional errors.

Figure 10:
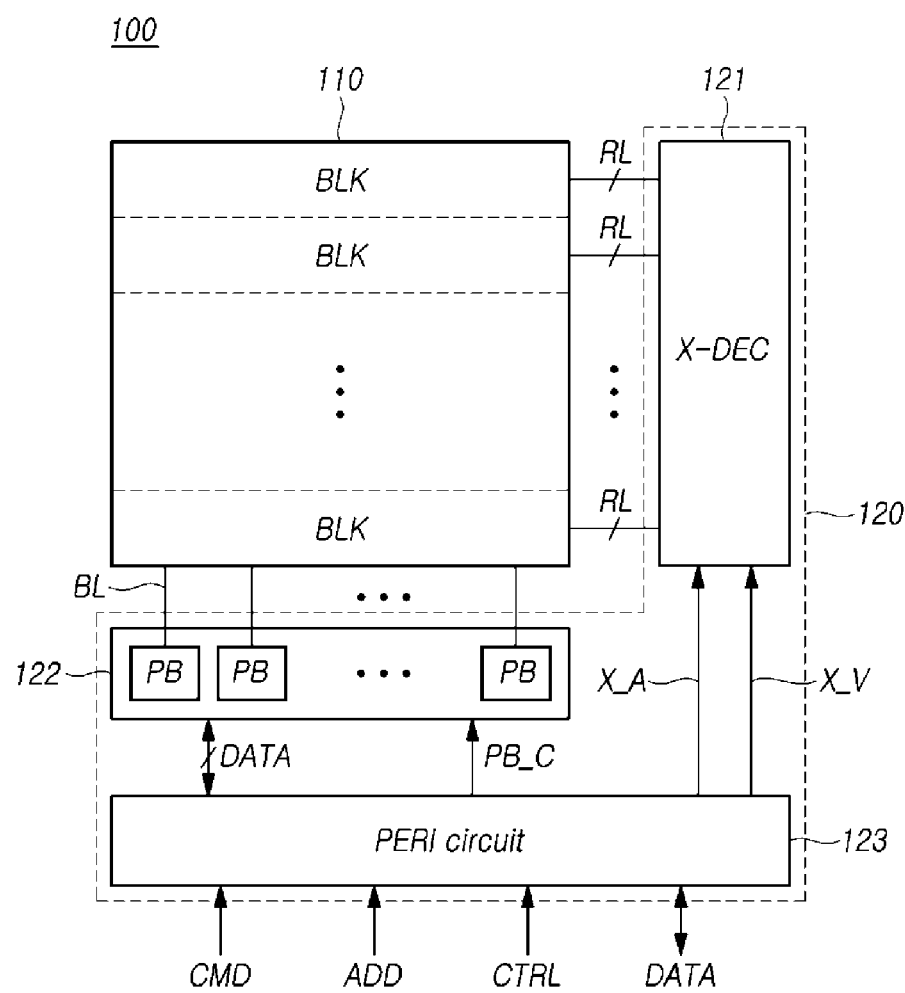
FIG. 10 is a block diagram schematically illustrating a memory device according to an embodiment of the present disclosure.

FIG. 10 is a block diagram schematically illustrating a memory device according to an embodiment of the present disclosure.

Referring to FIG. 10, a memory device 100 may include a memory cell array 110 and a logic circuit 120. The logic circuit 120 may include a row decoder (X-DEC) 121, a page buffer circuit 122 and a peripheral circuit (PERI circuit) 123.

The memory cell array 110 may be coupled to the row decoder (X-DEC) 121 through a plurality of row lines RL. The memory cell array 110 may be coupled to the page buffer circuit 122 through bit lines BL. The row lines RL may include at least one drain select line, a plurality of word lines and at least one source select line.

The memory cell array 110 may include a plurality of memory cells that are disposed in regions where the plurality of bit lines BL and the plurality of word lines WL intersect. The memory cell array 110 may include a plurality of memory blocks BLK. A memory block BLK may include a plurality of pages. The memory block BLK may be a basic unit of an erase operation, and the page may be a basic unit of a read operation.

The memory cell may be a volatile memory cell that loses data stored therein when power supply is cut off, or may be a nonvolatile memory cell that retains data stored therein even when power supply is cut off. For example, when the memory cell is a volatile memory cell, the memory device may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cell is a nonvolatile memory cell, the memory device may be an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The memory device may be a hybrid memory that includes both volatile memory cells and nonvolatile memory cells.

The memory cell may be a single level cell (SLC) that stores one-bit data or a multi-level cell (MLC), which stores two or more-bit data. The multi-level cell may store two-bit data, three-bit data, four-bit data, and so forth. The cell region 110 may include at least one of single level cells and multi-level cells.

The row decoder (X-DEC) 121 may select any one from among the memory blocks BLK included in the memory cell array 110, in response to a row address X_A provided from the peripheral circuit (PERI circuit) 123. The row decoder (X-DEC) 121 may transfer an operating voltage X_V, provided from the peripheral circuit (PERI circuit) 123, to row lines RL coupled to a memory block BLK that is selected from among the memory blocks BLK included in the memory cell array 110.

The page buffer circuit 122 may include a plurality of page buffers PB, which are coupled to memory cell array 110 through the bit lines BL, respectively. The page buffer circuit 122 may receive a page buffer control signal PB_C from the peripheral circuit (PERI circuit) 123, and may transmit and receive a data signal DATA to and from the peripheral circuit (PERI circuit) 123.

The page buffer circuit 122 may control the bit lines BL, which are connected to the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit (PERI circuit) 123 depending on the detected data. The page buffer circuit 122 may apply a signal to the bit line BL based on the data signal DATA, received from the peripheral circuit (PERI circuit) 123, in response to the page buffer control signal PB_C, and thereby, may write data to the memory cell of the memory cell array 110. The page buffer circuit 122 may write data to or read data from memory cells, which are coupled to an activated word line.

The peripheral circuit (PERI circuit) 123 may receive a command signal CMD, an address signal ADD and a control signal CTRL from outside the memory device, and may transmit and receive data DATA to and from a device outside the memory device, for example, a memory controller. The peripheral circuit (PERI circuit) 123 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit (PERI circuit) 123 may generate various voltages including the operating voltage X_V, which are required in the memory device.

Figure 11:
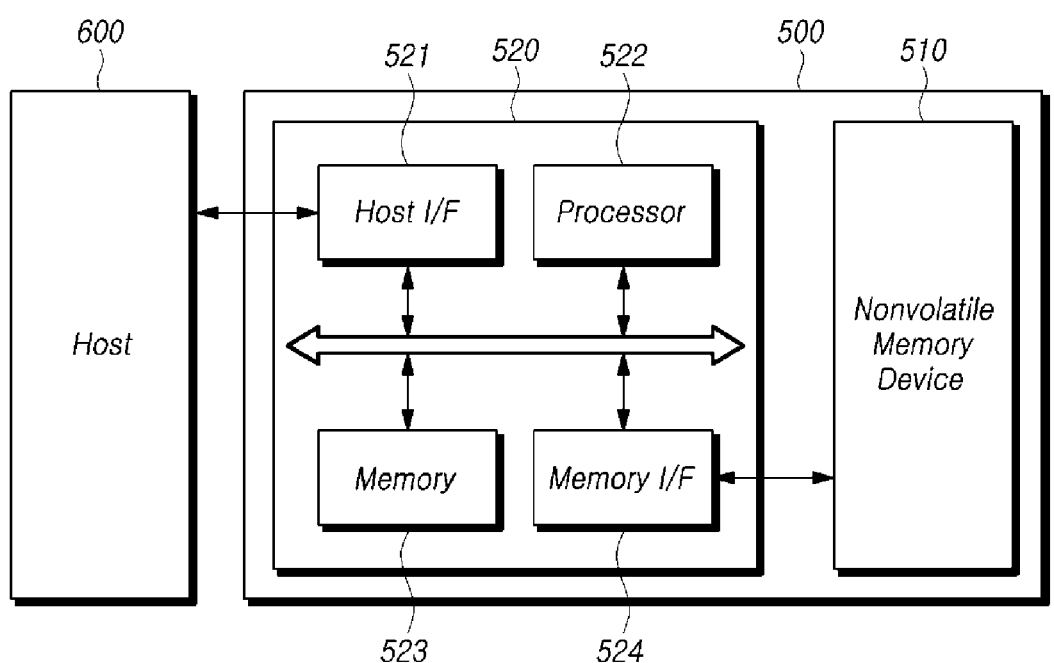
FIG. 11 is a block diagram schematically illustrating a memory system including a semiconductor device in accordance with an embodiment of the present disclosure.

FIG. 11 is a block diagram schematically illustrating a memory system including a semiconductor device in accordance with an embodiment of the present disclosure.

Referring to FIG. 11, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 11 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the semiconductor device according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface 521, a processor 522, the memory 523 and a memory interface 524. Although not illustrated in FIG. 11, the controller 520 may further include an ECC (error correction code) engine, which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 12:
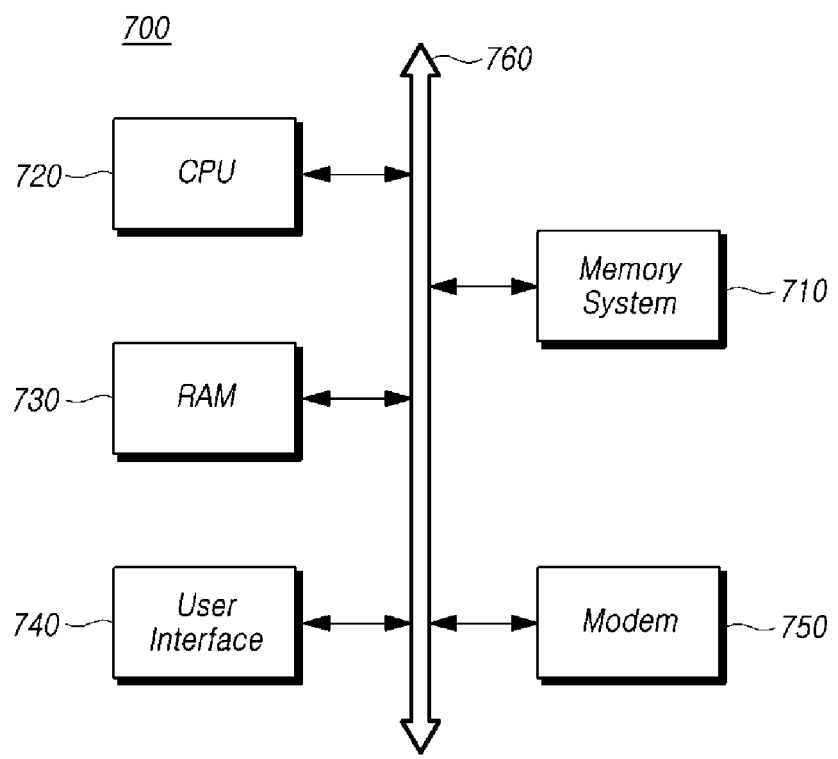
FIG. 12 is a block diagram schematically illustrating a computing system including a semiconductor device in accordance with embodiments of the present disclosure.

FIG. 12 is a block diagram schematically illustrating a computing system including a semiconductor device in accordance with embodiments of the disclosure.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although the detailed description of the present invention described above has been described with reference to the embodiments of the present disclosure, those skilled in the art or those having ordinary skill in the art will understand that the present invention can be variously modified and changed without departing from the spirit and scope of the present disclosure described in the claims to be described later.

What is claimed is:

1. A semiconductor device comprising:
 a stack including a plurality of electrode layers and a plurality of interlayer dielectric layers that are alternately stacked in a vertical direction on a substrate; and
 a plurality of vertical pass transistors disposed over the stack, and each of the plurality of vertical pass transistors coupled to a corresponding electrode layer,
 wherein the plurality of vertical pass transistors include a plurality of first vertical pass transistors and a plurality of second vertical pass transistors, and the plurality of second vertical pass transistors are disposed over the plurality of first vertical pass transistors in the vertical direction and staggered with the plurality of first vertical pass transistors in a first direction parallel to a top surface of the substrate, and
 wherein each of the plurality of vertical pass transistors staggered in the first direction partially overlaps with an adjacent staggered vertical pass transistor in the vertical direction.

2. The semiconductor device according to claim 1, further comprising:
 a step structure defined in the stack that exposes pad regions of the plurality of electrode layers,
 wherein the step structure, in a top view, is disposed in the first direction, and
 wherein, in a top view, the plurality of first vertical pass transistors and the plurality of second vertical pass transistors are alternately disposed in the first direction.

3. The semiconductor device according to claim 1, wherein
 each of the plurality of vertical pass transistors includes a semiconductor pillar that extends in the vertical direction, a gate dielectric layer that surrounds a sidewall of the semiconductor pillar and a gate conductive layer that surrounds a sidewall of the gate dielectric layer, and
 a pitch of the plurality of vertical pass transistors is smaller than an outer diameter dimension of the gate dielectric layer in the first direction.

4. The semiconductor device according to claim 1, wherein the plurality of first vertical pass transistors and the plurality of second vertical pass transistors share a gate conductive layer.

5. The semiconductor device according to claim 4, wherein
 each of the plurality of vertical pass transistors includes a semiconductor pillar that partially passes through the gate conductive layer in the vertical direction and a gate dielectric layer that isolates the semiconductor pillar and the gate conductive layer from each other, and
 semiconductor pillars of the plurality of first vertical pass transistors extend upward in the vertical direction from a bottom surface of the gate conductive layer, and semiconductor pillars of the plurality of second vertical pass transistors extend downward in the vertical direction from a top surface of the gate conductive layer.

6. The semiconductor device according to claim 4, wherein
 each of the plurality of vertical pass transistors includes a semiconductor pillar that partially passes through the gate conductive layer in the vertical direction and a gate dielectric layer that isolates the semiconductor pillar and the gate conductive layer, and
 a sum of a height of the semiconductor pillar of one of the plurality of first vertical pass transistors and a height of the semiconductor pillar of one of the plurality of second vertical pass transistors is smaller than the thickness of the gate conductive layer.

7. A semiconductor device comprising:
 a stack including a plurality of electrode layers and a plurality of interlayer dielectric layers that are alternately stacked in a vertical direction on a substrate;
 a gate conductive layer disposed over the stack;
 a plurality of semiconductor pillars extending in the vertical direction, each coupled to a corresponding electrode layer; and
 a plurality of gate dielectric layers that surround the plurality of semiconductor pillars and that are disposed between the plurality of semiconductor pillars and the gate conductive layer,
 wherein the plurality of semiconductor pillars includes a plurality of first semiconductor pillars and a plurality of second semiconductor pillars that are disposed over the plurality of first semiconductor pillars and that are staggered with the plurality of first semiconductor pillars in a first direction parallel to a top surface of the substrate, and wherein the plurality of first semiconductor pillars and the plurality of second semiconductor pillars are disposed in and share the same gate conductive layer.

8. The semiconductor device according to claim 7, further comprising:

a step structure defined in the stack that exposes pad regions of the plurality of electrode layers, wherein when viewed from the top, the step structure is disposed in the first direction, and wherein when viewed from the top, the plurality of first semiconductor pillars and the plurality of second semiconductor pillars are alternately disposed in the first direction.

9. The semiconductor device according to claim 7, wherein portions of the gate dielectric layers that surround the second semiconductor pillars overlap in the vertical direction with portions of the gate dielectric layers that surround adjacent first semiconductor pillars.

10. The semiconductor device according to claim 7, wherein a pitch of the plurality of semiconductor pillars is smaller than an outer diameter dimension of the gate dielectric layer in the first direction.

11. The semiconductor device according to claim 7, wherein the first semiconductor pillars and the second semiconductor pillars do not overlap with each other in the vertical direction.

12. The semiconductor device according to claim 7, wherein the plurality of first semiconductor pillars extend upward in the vertical direction from a bottom surface of the gate conductive layer, and the plurality of second semiconductor pillars extend downward in the vertical direction from a top surface of the gate conductive layer.

13. The semiconductor device according to claim 7, wherein a sum of a height of one of the plurality of first semiconductor pillars and a height of one of the plurality of second semiconductor pillars is less than the thickness of the gate conductive layer.

14. A semiconductor device comprising:

a stack including a plurality of electrode layers and a plurality of interlayer dielectric layers that are alternately stacked in a vertical direction on a substrate; and a plurality of vertical pass transistors disposed over the stack, and each of the plurality of vertical pass transistors coupled to a corresponding electrode layer, wherein the plurality of vertical pass transistors include a plurality of first vertical pass transistors and a plurality of second vertical pass transistors, and the plurality of second vertical pass transistors are disposed over the plurality of first vertical pass transistors in the vertical direction and staggered with the plurality of first vertical pass transistors in a first direction parallel to a top surface of the substrate, and wherein each of the plurality of vertical pass transistors staggered in the first direction partially overlaps with an adjacent staggered vertical pass transistor in the vertical direction, and wherein the plurality of first vertical pass transistors and the plurality of second vertical pass transistors share a gate conductive layer.

* * * * *